(12) United States Patent
Riedl et al.

(10) Patent No.: US 9,752,234 B2
(45) Date of Patent: Sep. 5, 2017

(54) ARC EVAPORATED $ME1_{1-a}ME2_aZI/MO_{1-b-c}SI_cB_bZII$ MULTILAYER COATINGS

(71) Applicant: Oerlikon Surface Solutions AG, Pfaffikon, Pfaffikon SZ (CH)

(72) Inventors: Helmut Riedl, Kirchberg/Walde (AT); Mirjam Arndt, Bad Ragaz (CH); Peter Polcik, Reutte (AT); Paul Heinz Mayrhofer, Neckenmarkt (AT)

(73) Assignee: OERLIKON SURFACE SOLUTIONS AG, PFAFFIKON, Pfaffikon SZ (CH)

(*) Notice: Subject to any disclaimer, the term of this patent is extended or adjusted under 35 U.S.C. 154(b) by 0 days.

(21) Appl. No.: 15/326,065

(22) PCT Filed: Jul. 24, 2015

(86) PCT No.: PCT/EP2015/067023
§ 371 (c)(1),
(2) Date: Jan. 13, 2017

(87) PCT Pub. No.: WO2016/012600
PCT Pub. Date: Jan. 28, 2016

(65) Prior Publication Data
US 2017/0211189 A1 Jul. 27, 2017

Related U.S. Application Data

(60) Provisional application No. 62/028,519, filed on Jul. 24, 2014.

(51) Int. Cl.
*C23C 28/00* (2006.01)
*C23C 14/35* (2006.01)
(Continued)

(52) U.S. Cl.
CPC ............ *C23C 28/42* (2013.01); *C23C 14/067* (2013.01); *C23C 14/0641* (2013.01);
(Continued)

(58) Field of Classification Search
USPC ....... 204/192.15, 192.16; 428/216, 336, 697, 428/698, 699, 704
See application file for complete search history.

(56) References Cited

U.S. PATENT DOCUMENTS 5,595,616 A * 1/1997 Berczik ................... C22C 27/04
420/429
2004/0219295 A1* 11/2004 Perepezko .............. C23C 26/00
428/704

(Continued)

FOREIGN PATENT DOCUMENTS

JP 03-247778 * 11/1991
WO 2008/119173 A1 10/2008
WO 2014/037072 A1 3/2014

OTHER PUBLICATIONS

Perepzko et al "Enviromental Resistance of Mo0Si-B Alloys" Oxi Met (2013) p. 207-218.*

(Continued)

*Primary Examiner* — Archene Turner
(74) *Attorney, Agent, or Firm* — Pearne & Gordon LLP

(57) ABSTRACT

A coating including a multilayer film, which includes a multi-layered structure including layers of the type I and layers of the type II. The layers of the type I are metal nitride with a chemical composition given by the formula $Me1_{1-a}Me2_aZI$ and the layers of the type II are a Mo-comprising material with chemical composition given by the formula $Mo_{1-b-c}Si_cB_bZII$ or $Mo_{1-b-c}Si_cB_b$. Also described is a method for depositing the above mentioned coating.

13 Claims, 9 Drawing Sheets

(51) Int. Cl.
    *C23C 14/34*    (2006.01)
    *C23C 14/06*    (2006.01)
    *C23C 14/32*    (2006.01)
    *C23C 28/04*    (2006.01)

(52) U.S. Cl.
    CPC ........ *C23C 14/325* (2013.01); *C23C 14/3485* (2013.01); *C23C 14/35* (2013.01); *C23C 28/042* (2013.01)

(56) References Cited

U.S. PATENT DOCUMENTS

| | | |
|---|---|---|
| 2005/0170162 A1 | 8/2005 | Yamamoto |
| 2006/0018760 A1* | 1/2006 | Bruce .................... C23C 30/00 416/229 A |
| 2008/0128472 A1* | 6/2008 | Park .................. B23K 20/1255 228/2.1 |
| 2013/0303414 A1 | 11/2013 | Ramm |

OTHER PUBLICATIONS

Lange et al "Oxidation behaviour of magntron sputtered double layer coatings containing molybdenum, silicon and boron" Intermetallics 24 (2014) p. 19-27.*

Kiryukhantsev_Korneev et al The Influence of SI Concentrations on the Oxidation of Mo—Si—B—(N) Coatings Russ Jorn of Non-Ferrous Metals, vol. 55 No. 6 (2014) p. 645-655.*

International Search Report for PCT/EP2015/067023 dated Oct. 9, 2015.

* cited by examiner

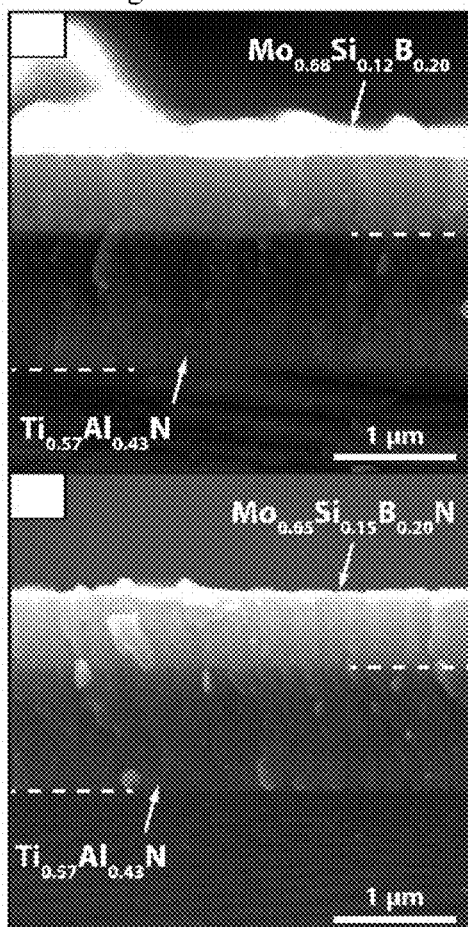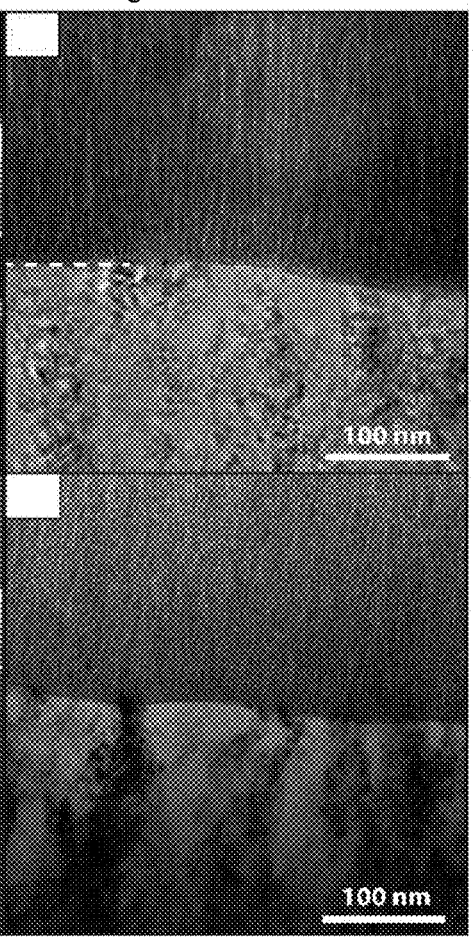
Fig. 2a  Fig. 2b
Fig. 2c  Fig. 2d

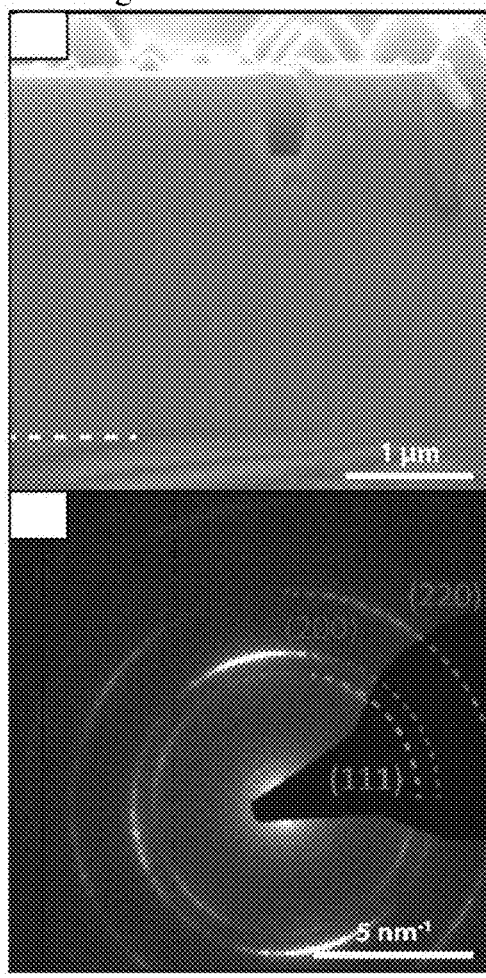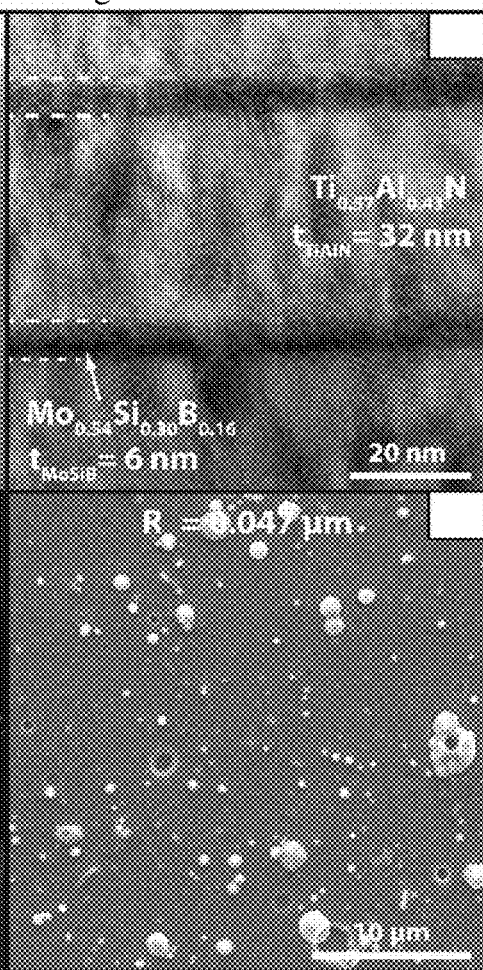
Fig. 3a  Fig. 3b
Fig. 3c  Fig. 3d

Fig. 4a
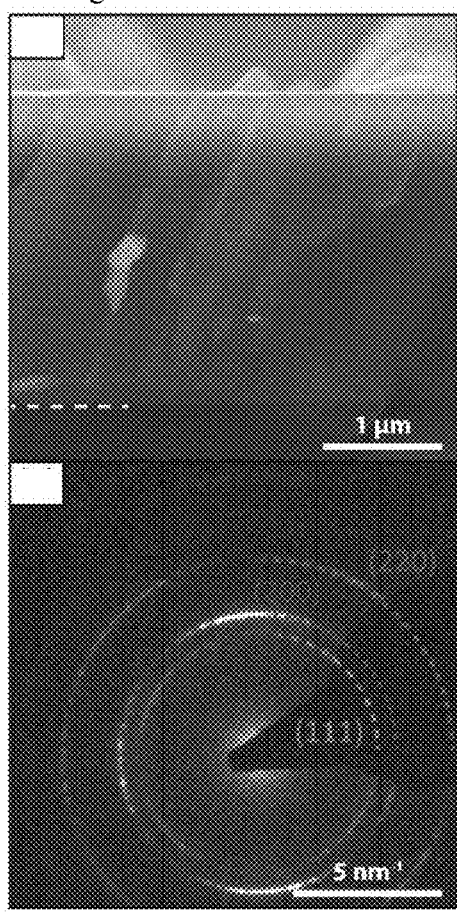
Fig. 4c
Fig. 4b
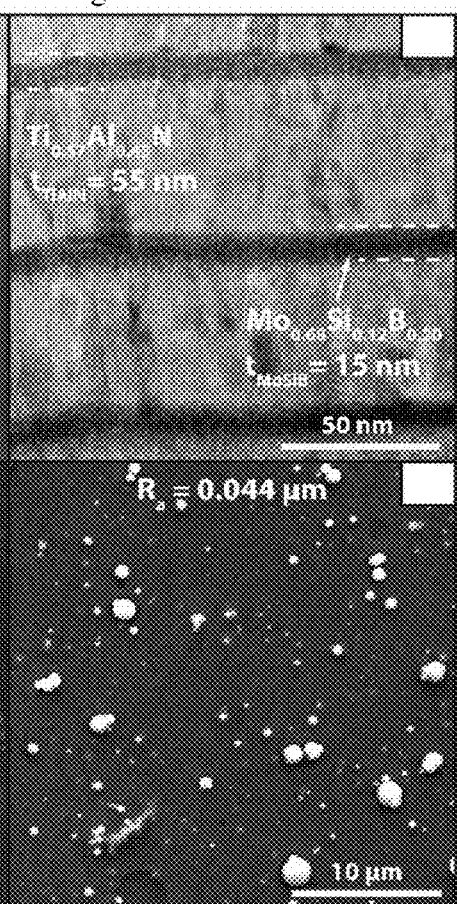
Fig. 4d

ARC EVAPORATED $ME1_{1-a}ME2_aZI/MO_{1-b-c}SI_cB_bZII$ MULTILAYER COATINGS

The present invention relates to a coating comprising a multilayer film, which is characterized by an multi-layered structure comprising layers of the type I and layers of the type II, wherein the layers of the type I consist of metal nitride with chemical composition given by the formula $Me1_{1-a}Me2_aZI$ and the layers of the type II consist of a Mo-comprising material with chemical composition given by the formula $Mo_{1-b-c}Si_cB_bZII$ or $Mo_{1-b-c}Si_cB_b$. The present invention relates furthermore to a method for depositing the above mentioned coating.

BACKGROUND

High temperature oxidation resistance combined with excellent mechanical and tribological properties are typical requirements for state of the art protective coatings.

The growing demands in forming and machining operations, especially in dry machining, typically require further optimizations of well-established coating systems such as TiN, $Ti_{1-x}Al_xN$, and $Cr_{1-x}Al_xN$. Major failure mechanisms in dry high-speed cutting are flank and crater wear, caused through abrasion, adhesion, as well as tribooxidation, and surface fatigue, which all limit the service lifetime of coated tools. Different studies pointed out that such diverse requirement profiles can be controlled through the application of high temperature self-lubricating coatings such as TiAlN/VN, $Si_3N_4$—BN, TiC—C, or $MoS_2$.

Solid lubricants are characterized by phases exhibiting easy shear planes, where Magnéli phase oxides (e.g., $V_2O_5$, $TiO_2$, and $MoO_3$) are typical examples for high-temperature applications (500 to 1000° C.). Especially, molybdenum is well-known to easily form various Magnéli phases, $Mo_nO_{3n-1}$, in a wide temperature range starting at 400° C. However, the problem with Mo is the pesting phenomena (i.e., the formation of volatile oxides) leading to an inferior oxidation resistance due to the lack of dense, adherent, and stable oxide scales. Previous studies in the field of high-temperature bulk materials as well as physical vapor deposited coatings highlight that alloying Mo with Si and B results in excellent oxidation resistance as well as thermal stability, even up to 1300° C. The obtained phases, $Mo_3Si$, $T_1$-$Mo_5Si_3$, and $T_2$-$Mo_5SiB_2$, do not completely inhibit the formation of $MoO_3$, but clearly reduce its volatility. In the low temperature regime, between 650 and 750° C., a slightly porous borosilica scale is formed protecting the underlying material. With increasing temperatures, the borosilica is depleted in B, and the formation of a denser $SiO_2$ scale is promoted. The formation of volatile $MoO_3$ from Mo—Si—B based materials decreases with increasing temperature. Crucial for this behavior is the appropriate phase combination ($MoSi_3$, $Mo_5Si_3$, and $Mo_5SiB_2$) and chemical composition within the Mo—Si—B system in general. To combine highest oxidation resistance with excellent mechanical properties, the chemical composition of $Mo_{1-x-y}Si_xB_y$ thin films should fulfill the requirement of $y/(x+y)\approx 0.25$ with $x+y\geq 0.35$. Thereby, hardnesses of 20 GPa and excellent oxidation resistance (~500 nm consumed layer thickness even after 1 h oxidation at 1300° C.) can be obtained. Other molybdenum based systems for enhanced tribological properties are architectural arrangements with $MoS_2$, $Mo_2N$, or MoCN.

WO2014037072A1 discloses coatings containing Mo on tools used for direct hot forming. It is proposed to apply on the tool to a coating system, which contain one or more layer packages comprising a high-temperature-active lubricating layer which with increasing distance from the substrate follows a high-temperature-stabilized layer (called also HT-layer in WO2014037072A1).

Specifically, the coating system according to WO2014037072A1 comprises a layer system made of alternating molybdenum-rich and molybdenum-poor layers, wherein the molybdenum-poor layers are the HT-layers having for example a chemical composition given by the formula $(Me_{WO1}, Me_{WO27} Mo_{WOa})N$, and the molybdenum-rich layers are the lubricating layers having for example a chemical composition given by the formula $(Me_{WO3}, Me_{WO4}, Mo_{WOb})_N$, with $0\leq_{WOa}<_{WOb}<1$ and $Me_{WO1}$, $Me_{WO2}$, $Me_{WO3}$ and $Me_{WO4}$ being elements selected from Al, Cr, Ti, and preferably $Me_{WO1}=Me_{WO3}$ and/or $Me_{WO2}=Me_{WO4}$. WO2014037072A1 teaches furthermore that the molybdenum-rich layers can also comprises one or more elements selected from C, O, Si, V, W, Zr, Cu and Ag for improving lubrication, while the molybdenum-poor layers can also comprises one or more elements selected from Si, W, Zr and B for improving high temperature stability.

Previous studies in the field of PVD processed low friction coatings pointed out the possibilities of architectural designs, such as multilayer or nanocomposite coatings (e.g. TiAlN/VN, TiC—C), to combine particular properties and hence gain superior tribological properties.

SUMMARY

The inventors found that surprisingly particularly good tribological properties can be attained in coatings which have a multilayered structure consisting of $Me1_{1-a}Me2_aZI$ and $Mo_{1-b-c}Si_eB_bZII$ layers or $Me1_{1-a}Me2_aZI$ and $Mo_{1-b-c}Si_cB_b$ layers deposited alternating one on each other, when at least the layers of the type I or at least the layers of the type II are deposited by means of arc physical vapour deposition methods. According to a preferably embodiment of the present invention both the layers of the type I and the layers of the type II are deposited by means of arc physical vapour deposition methods.

In the context of the present invention Me1 is one element selected from the group consisting of the groups IVB, VB, and VIIB of the periodic table of the elements except molybdenum. Me2 is one element selected from the group consisting of the group IIIA of the periodic table of the elements and silicon. Mo is molybdenum, Si is silicon, B is boron. Both ZI and ZII can consists of one or more elements selected from the group consisting of carbon (C), oxygen (O) and nitrogen (N) but ZI can be identical or different from ZII. However, as the layers of the type I consist as a metal nitride with chemical composition $Me1_{1-a}Me2_aZI$, ZI sloud contain N, it means that ZI can be N or CN or CON. The coefficient "a" corresponds to the concentration of Me2 in the layer of the type I if only Me1 and Me2 are considered for the evaluation of the element concentration. The coefficients "b" and "c" corresponds to the concentration of boron and silicon in the layer of the type II, respectively, if only Mo, Si and B are considered for the evaluation of the element concentration.

According to a further preferred embodiment of a coating according to the present invention particularly good mechanical and tribological properties were attained by depositing inventive coatings comprising layers of the type I consisting of $Ti_{1-a}Al_aN$ and layers of the type II consisting of $Mo_{1-b-c}Si_bB_c$.

According to the present invention the $Ti_{1-a}Al_aN$ layers can be deposited by arc evaporation of mixed Ti—Al targets in nitrogen atmosphere. According to the present invention the $Mo_{1-b-c}Si_bB_c$ layers can be deposited by arc evaporation of a mixed Mo—Si—B target (a target comprising Mo, Si and B) or of separated Mo, Si, and B targets. In some cases for example it could be advantageously to use combinations of targets, for example for the deposition of the $Mo_{1-b-c}Si_bB_c$ it could be used a Mo—Si target and a B target or a Mo—B target and a Si target or a Si—B target and a Mo target, or a Mo—Si—B target and a Mo—B target, or 2 or more targets comprising the same elements but in different atomic concentrations.

According to the present invention it is also possible to deposit the $Ti_{1-a}Al_aN$ layers by arc evaporation of mixed Ti—Al targets in nitrogen atmosphere and to deposit the $Mo_{1-b-c}Si_bB_c$ layers by sputtering or HIPIMS (HIPIMS= high-power impulse magnetron sputtering) of a mixed Mo—Si—B target (a target comprising Mo, Si and B) or of separated Mo, Si, and B targets. In some cases for example it could be advantageously to use combinations of targets, for example for the deposition of the $Mo_{1-b-c}Si_bB_c$ it could be used a Mo—Si target and a B target or a Mo—B target and a Si target or a Si—B target and a Mo target, or a Mo—Si—B target and a Mo—B target, or 2 or more targets comprising the same elements but in different atomic concentrations.

According to the present invention the coefficients "b" and "c" can vary between 0 and 0.99 atom %.

The combination of $Ti_{1-a}Al_aN$—as a well-established thin film showing high hardness and thermal stability—and $Mo_{1-b-c}Si_bB_c$—as a Mo based coating system with excellent thermal stability and the ability to form lubricious Magnéli phase oxides such as $Mo_nO_{3n-1}$—allows attaining excellent wear behavior at elevated temperatures.

According to one more preferred embodiment of the present invention coatings exhibiting a particular high thermal stability and high oxidation resistance can be produced by adjusting the chemical composition of the $Mo_{1-b-c}Si_bB_c$ layers in such a manner that stable borosilica scales can be formed and at the same time the necessary ability for oxidation to form $Mo_nO_{3n-1}$ Magnéli phase oxides is attained.

For producing and examining some coating according to the present invention, the coating architecture was modified by varying the bilayer period between 4 and 240 nm.

Some individual coating properties, such as hardness, wear rate, coefficient of friction, and thermal stability of the inventive coatings could be correlated with further coating properties which were obtained by detailed transmission electron microscopy examinations.

$Ti_{1-x}Al_xN$ is one of the most widely used protective coating systems exhibiting excellent mechanical properties and phase stability at elevated temperatures. The superior mechanical characteristics of $Ti_{1-x}Al_xN$ can be attributed to the formation of face-centered-cubic (fcc) TiN and AlN rich domains during the early stages of spinodal decomposition of supersaturated fcc $Ti_{1-x}Al_xN$ (leading to age-hardening). The oxidation resistance of $Ti_{1-x}Al_xN$ is defined through the Ti to Al ratio, whereas Al-rich coatings are more effective in the formation of alumina rich dense oxide scales.

By combining $Ti_{1-x}Al_xN$ with $Mo_{1-x-y}Si_xB_y$ based layers according to the present invention it is possible to produce coatings which exhibit the ability to form lubricious oxide phases ($Mo_nO_{3n-1}$) integrated with excellent oxidation resistance, which results in outstanding wear and oxidation behavior at elevated temperatures.

Various multilayer combinations, between Ti—Al—N, Mo—Si—B and Mo—Si—B—N, were developed in the context of the present invention and investigated with respect to their growth morphology, mechanical properties, oxidation resistance, and wear performance at temperatures up to 900° C.

BRIEF DESCRIPTION OF THE DRAWINGS

FIG. 1a shows a cross sectional TEM of a Ti0.57Al0.43N/Mo0.54Si0.30B0.16 multilayer (☐=35 nm) exposed to ambient air at 900° C. for 1000 min. FIG. 1b shows a higher magnification of the oxidized area above the droplet-overgrowing multilayer. FIG. 1c shows a TEM-EDS linescan across the oxide scale and Ti0.57Al0.43N/ Mo0.54Si0.30B0.16 multilayer (indicated in FIG. 1a by a vertical line).

FIGS. 2a-2d: Cross sectional SEM and TEM images of ~0.7 μm thin $Mo_{0.68}Si_{0.12}B_{0.20}$ and $Mo_{0.65}Si_{0.15}B_{0.20}N$ coatings on top of an arc evaporated $Ti_{0.57}Al_{0.43}N$ adhesion and supporting layer (~1.1 μm).

FIGS. 3a-3d: Cross sectional SEM and BF TEM images of the multilayered $Ti_{0.53}Al_{0.47}N/Mo_{0.54}Si_{0.30}B_{0.16}$ coating with corresponding SAED pattern and surface topography image on steel substrates. The coating exhibits 6 nm thin $Mo_{0.54}Si_{0.30}B_{0.16}$ layers and a bilayer period of λ=35 nm.

FIGS. 4a-4d: Cross sectional SEM and BF TEM images of the multilayered $Ti_{0.53}Al_{0.47}N/Mo_{0.68}Si_{0.12}B_{0.20}$ coating, exhibiting 15 nm thin $Mo_{0.68}Si_{0.12}B_{0.20}$ layers and a bilayer period of λ=70 nm, with corresponding SAED pattern and surface topography images.

Figure 1A:
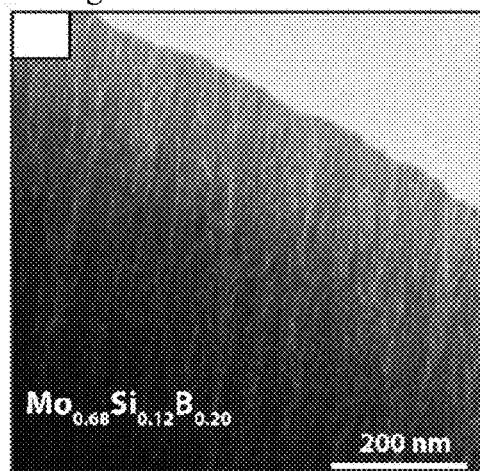
FIGS. 1a-1d: Cross sectional TEM studies of $Mo_{0.68}Si_{0.12}B_{0.20}$ and $Mo_{0.65}Si_{0.15}B_{0.20}N$ coatings. Crystalline areas within $Mo_{0.65}Si_{0.15}B_{0.20}N$ are highlighted with solid lines.

DETAILED DESCRIPTION $Ti_{1-x}Al_xN$, $Mo_{1-x-y}Si_xB_y$, $Mo_{1-x-y}Si_xB_yN$, and multilayered $Ti_{1-x}Al_xN/Mo_{1-x-y}Si_xB_y$ coatings were deposited using an industrial coating system of the type INNOVA manufactured by the company Oerlikon Balzers. The coating system was equipped with arc cathodes and sputtering cathodes in order to allow cathodic deposition arc or cathodic sputter deposition or simultaneous cathodic arc/sputter deposition. The targets used as arc cathodes and sputtering cathodes were $Ti_{0.50}Al_{0.50}$, $Mo_{0.50}Si_{0.30}B_{0.20}$, and $Mo_{0.625}Si_{0.125}B_{0.25}$ targets having 99.96% purity, which were produced by using powder-metallurgical techniques by the company Plansee Composite Materials GmbH.

All $Ti_{1-x}Al_xN$ coatings and the $Ti_{1-x}Al_xN$ layers of the multilayered coating structures were prepared by arc evaporation of the $Ti_{0.50}Al_{0.50}$ targets using a cathode current of 150 A and a pure nitrogen atmosphere at a constant gas flow of 1000 sccm. $Mo_{1-x-y}Si_xB_y$ and $Mo_{1-x-y}Si_xB_yN$ coatings were sputter deposited on an arc evaporated $Ti_{1-x}Al_xN$ adhesion and supporting layer. Here, the term homogeneously means that all targets used for the deposition have the same chemical composition and also the other parameters (such as discharge current and gas flow) were constant during the preparation. The $Mo_{1-x-y}Si_xB_y$ coatings and the $Mo_{1-x-y}Si_xB_y$ layers of the multilayered $Ti_{1-x}Al_xN/Mo_{1-x-y}Si_xB_y$ coatings were sputter deposited in a pure Ar atmosphere using a flow of 500 sccm and powering the $Mo_{0.50}Si_{0.30}B_{0.20}$ and $Mo_{0.625}Si_{0.125}B_{0.25}$ targets with ~11 W/cm². The $Mo_{1-x-y}Si_xB_yN$ coating and $Mo_{1-x-y}Si_xB_yN$ layer on arc evaporated $Ti_{1-x}Al_xN$ were sputter deposited in a mixed $N_2$/Ar atmosphere applying gas flows of $N_2$=400 sccm and Ar=600 sccm, and powering the $Mo_{0.50}Si_{0.30}B_{0.20}$ and $Mo_{0.625}Si_{0.125}B_{0.25}$ targets with ~11 W/cm². The arc deposited $Ti_{1-x}Al_xN$ adhesion and supporting layers were prepared with a bias potential of −120 V, while for their sputtered $Mo_{1-x-y}Si_xB_y$ and $Mo_{1-x-y}Si_xB_yN$ layers a −40 V bias was used. The multilayered $Ti_{1-x}Al_xN/Mo_{1-x-y}Si_xB_y$ coatings were prepared by arc evaporation of $Ti_{1-x}Al_xN$ in $N_2$ atmosphere with −65 V bias and sputtering of $Mo_{1-x-y}Si_xB_y$ in Ar atmosphere with −40V bias. Their bilayer periods were varied through changing the deposition time of the individual layers. The $Ti_{1-x}Al_xN/Mo_{1-x-y}Si_xB_y$ multilayers prepared with the $Mo_{0.50}Si_{0.30}B_{0.20}$ target exhibits a total coating thickness of ~2.80 μm after 80 bilayers. As the sputter rate of the higher Mo-containing $Mo_{0.625}Si_{0.125}B_{0.25}$ target is nearly twice that of $Mo_{0.50}Si_{0.30}B_{0.20}$, we also doubled the timer for the individual arc evaporated $Ti_{1-x}Al_xN$ layers. Thus, we reduced the numbers of bilayers to 40 to obtain a comparable overall thickness of ~2.80 μm. All coatings were deposited on low alloy steel foil (thickness 0.2 mm), polished austenite platelets (20×7×0.8 mm³), Si platelets (100-orientation, 20×7×0.38 mm³), $Al_2O_3$ platelets (0001-orientation, 10×10×0.53 mm³), polycrystalline $Al_2O_3$ platelets (20×7×0.5 mm³), and polished high speed steel disks (DIN 1.3343-Ø30 mm, thickness 10 mm). Prior to the deposition process the substrates were ultrasonically cleaned in acetone and ethanol for 5 min each, and argon ion etched for 25 min applying the Oerlikon Balzers Central Beam Etching technology (immediately before starting the deposition process within the deposition chamber). The deposition temperature was set to 500° C. and the substrates were rotated using a two-fold rotating carousel.

The structure of the coatings and targets was investigated by X-ray diffraction (XRD) using an Empyrean Panalytical diffractometer ($CuK_\alpha$ radiation source) in Bragg Brentano and grazing incidence geometry (incidence angel, $\Omega$=3°).

The oxidation resistance of our coatings (on sapphire substrates), were studied by ambient air annealing in a box furnace at $T_{ox}$=900° C. for $t_{ox}$=10, 100, and 1000 min. In addition, isothermal oxidation treatments of selected coatings (removing their steel foil substrates with a diluted hydrochloric acid to avoid substrate interference) were performed using differential scanning calorimetry (DSC) combined with thermogravimetric analysis (TGA) at $T_{ox}$=900 and 1000° C. for $t_{ox}$=300 min. A detailed description of the measurement procedure can be found in R. Hollerweger, H. Riedl, J. Paulitsch, M. Arndt, R. Rachbauer, P. Polcik, et al., Origin of High Temperature Oxidation Resistance of Ti—Al—Ta—N Coatings, (2014). doi:10.1016/j.surfcoat.2014.02.067.

The growth morphology of the coatings was investigated through fracture cross-sections and top view imaging with a FEGSEM Quanta 200 scanning electron microscope (SEM) operated at an acceleration voltage of 15 keV. Selected samples are further studied by cross section transmission electron microscopy (TEM) using a FEI Tecnai F20 field emission TEM operated with an acceleration voltage of 200 kV, and by selected-area electron diffraction (SAED).

The oxidized coatings were chemically analysed by energy dispersive X-ray spectroscopy (EDS) linescans during cross-sectional SEM and TEM studies. SEM-EDS linescans are performed on hot embedded samples (in Struers Poly Fast), which were metallographically prepared with a final 1 μm diamond suspension polishing step. TEM and TEM-EDS line scan investigations are performed on cross-sections prepared with a gallium focused ion beam (FIB, FEI Quanta 200 3D) operated with 5 keV and 0.1 nA for the final polishing step.

The $Ti_{1-x}Al_xN$ coatings were chemically investigated by SEM-EDS. To overcome the difficulties in quantification of the boron content, our $Mo_{1-x-y}Si_xB_y$ and $Mo_{1-x-y}Si_xB_yN$ coatings were analysed by laser ablation combined with inductive coupled plasma-mass spectroscopy (LA-ICP-MS).

The mechanical properties, hardness (H) and indentation modulus (E), were obtained by analysing the load- and unload-displacement curves of nanoindentation measurements using an Ultra-Micro-Indentation II system (UMIS) equipped with a Berkovich diamond tip after Oliver and Pharr: W. C. Oliver, G. M. Pharr, An improved technique for determining hardness and elastic modulus using load and displacement sensing indentation experiments, J. Mater. Res. 7 (1992) 1564-1583. doi:10.1557/JMR.1992.1564.

Dry sliding tribological investigations were conducted on a standard pin (or ball) on disk testing system (Nanovea) equipped with $Al_2O_3$ balls ($d_{ball}$=6 mm) and loaded with 1 N. The coatings, on high speed steel disks, are tested in ambient air with a sliding speed of 0.1 m/s at temperatures of $T_{Tribo}$=RT, 500, and 700° C. and radii of r=11, 8, and 11 mm, respectively. The wear tracks are analysed by chromatographic profilometry (Nanovea).

Figure 1B:
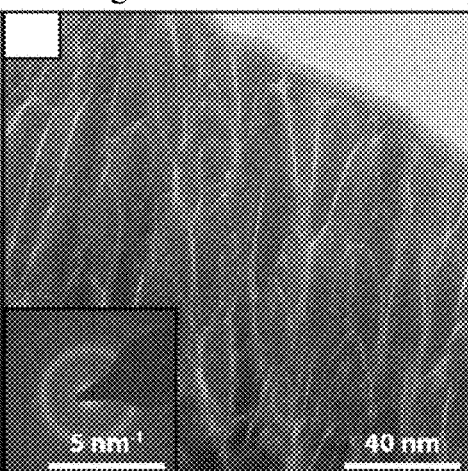
Figures 1C, 1D:
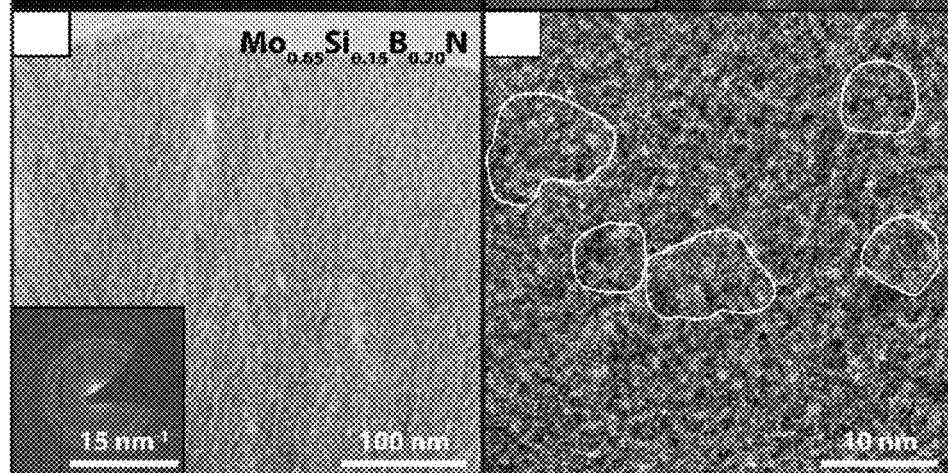

Morphology and Chemical Composition of the Deposited Coatings:

The chemical composition of the monolithic $Mo_{1-x-y}Si_xB_y$ coatings, sputtered in Ar atmosphere from the $Mo_{0.625}Si_{0.125}B_{0.25}$ and $Mo_{0.50}Si_{0.30}B_{0.20}$ targets, correspond to $Mo_{0.68}Si_{0.12}B_{0.20}$ and $Mo_{0.54}Si_{0.30}B_{0.16}$. Effects, like gas scattering which are more pronounced for lighter elements, can account for the small loss of boron. The coatings exhibit an amorphous like character as it is shown in the cross sectional TEM images of $Mo_{0.68}Si_{0.12}B_{0.20}$ with different magnification in the FIGS. 1a and b. The few nm sized, in growth direction slightly elongated grains, are surrounded by a bright appearing tissue phase. Bright field TEM investigations suggest this tissue phase to be enriched in light elements, hence Si and/or B rich. Further studies by, for example, electron energy loss spectroscopy line scans across these tissue phases are needed for more detailed information about their composition and morphology. However, this tissue phase is responsible for renucleation events leading to small grain sizes with an amorphous appearance even during higher magnification TEM studies, which is further suggested by the low intensity continuous SAED ring patterns, FIG. 1b. Sputtering the $Mo_{0.625}Si_{0.125}B_{0.25}$ target in a mixed $Ar/N_2$ atmosphere leads to the formation of $Mo_{0.65}Si_{0.15}B_{0.20}N$ thin films, with a general columnar, feather-like appearance, FIG. 1c, typical for segregation-driven renucleation. However, compared to the $Mo_{0.68}Si_{0.12}B_{0.20}$ coating, FIG. 1b, the SAED pattern of $Mo_{0.65}Si_{0.15}B_{0.20}N$, FIG. 1c, shows diffraction rings from different lattice planes, suggesting for a nano-crystalline structure. Small crystalline areas, with an average size of around 5-10 nm can also be identified by high resolution cross-section TEM investigations, see the areas highlighted with white lines in FIG. 1d.

$Mo_{0.68}Si_{0.12}B_{0.20}$ and $Mo_{0.65}Si_{0.15}B_{0.20}N$ coatings were sputter deposited on top of arc evaporated $Ti_{0.57}Al_{0.43}N$ adhesion and supporting layers (to investigate their adherence and crystalline structure) for a better understanding during the preparation of multilayered coatings composed of arc evaporated $Ti_{0.57}Al_{0.43}N$ and sputtered $Mo_{1-x-y}Si_xB_y$ layers. The adhesion between arc evaporated $Ti_{0.57}Al_{0.43}N$ and sputtered $Mo_{0.68}Si_{0.12}B_{0.20}$ respectively $Mo_{0.65}Si_{0.15}B_{0.20}N$ layers is excellent, FIGS. 2a,b and c,d. The continuing columns across the interface between $Ti_{0.57}Al_{0.43}N$ and $Mo_{0.65}Si_{0.15}B_{0.20}N$ even suggests for partially coherent regions, FIG. 2d. However, glancing angle XRD studies suggest again for an amorphous or nano-crystalline structure of the $Mo_{0.68}Si_{0.12}B_{0.20}$ and $Mo_{0.65}Si_{0.15}B_{0.20}N$ layer, even when growing them on top of arc evaporated $Ti_{0.57}Al_{0.43}N$ layers. The surface roughness $R_a$ is between 0.038 and 0.056 μm for the $Mo_{0.68}Si_{0.12}B_{0.20}/Ti_{0.57}Al_{0.43}N$ and $Mo_{0.65}Si_{0.15}B_{0.20}N/Ti_{0.57}Al_{0.43}N$ compound coatings.

The multilayered $Ti_{1-x}Al_xN/Mo_{1-x-y}Si_xB_y$ coatings, prepared by arc evaporation of $Ti_{0.50}Al_{0.50}$ targets and sputtering of $Mo_{0.50}Si_{0.30}B_{0.20}$ targets with 80 bilayers (overall thickness of ~2.80 μm), exhibit a very dense featureless fracture cross section, FIG. 3a. TEM cross sections reveal a bilayer period λ of 35 nm composed of 6 nm thin $Mo_{0.54}Si_{0.30}B_{0.16}$ and 29 nm thin $Ti_{0.57}Al_{0.43}N$ layers, FIG. 3b. The chemical notification of these layers is based on their homogeneously prepared thicker counterparts. The $Mo_{0.54}Si_{0.30}B_{0.16}$ layers supress the formation of a pronounced columnar growth morphology which would be typical for $Ti_{1-x}Al_xN$ coatings leading to the featureless fracture cross section as presented in FIG. 3a. SAED patterns (FIG. 3c) clearly indicate a face-centered-cubic $Ti_{1-x}Al_xN$-based crystalline structure. The higher intensity of the (200) diffraction rings, especially in growth direction, suggests for a predominant 200-growth orientation. (Please note, that the SAED is taken from the cross section, hence the patterns are not along the growth orientation as during plane view investigations.)

The multilayered $Ti_{0.57}Al_{0.43}N/Mo_{1-x-y}Si_xB_y$ coatings prepared by arc evaporation of the $Ti_{0.50}Al_{0.50}$ targets and sputtering of the $Mo_{0.625}Si_{0.125}B_{0.25}$ targets, with 40 bilayers to keep the overall coating thickness comparable to the previous multilayer (thickness of ~2.80 μm), again exhibit a featureless growth morphology during cross sectional SEM investigations, FIG. 4a. The 70 nm thin bilayer is composed of 55 nm $Ti_{0.57}Al_{0.43}N$ and 15 nm $Mo_{0.68}Si_{0.12}B_{0.20}$, FIG. 4b. The $Mo_{0.68}Si_{0.12}B_{0.20}$ layers are clearly thicker as their $Mo_{0.54}Si_{0.30}B_{0.16}$ counterparts of the previous discussed multilayer, which is mainly based on the higher sputtering rate of the higher Mo-containing $Mo_{0.625}Si_{0.125}B_{0.25}$ target, please compare FIGS. 3b and 4b. SAED again suggest for a 200 oriented growth, FIG. 4c, with slightly larger grains as compared to the $Ti_{0.57}Al_{0.43}N/Mo_{0.54}Si_{0.30}B_{0.16}$ multilayers, which is also based on the thicker $Ti_{0.57}Al_{0.43}N$ layers. Nevertheless, the $Mo_{0.68}Si_{0.12}B_{0.20}$ layers again hinder the development of a pronounced columnar growth morphology and lead to the formation of very dense coatings. Both multilayered coatings, $Ti_{0.57}Al_{0.43}N/Mo_{0.54}Si_{0.30}B_{0.16}$ and $Ti_{0.57}Al_{0.43}N/Mo_{0.68}Si_{0.12}B_{0.20}$, have smooth surfaces with roughnesses of about $R_a \approx 0.050$ μm, see FIGS. 3d and 4d.

Figure 5:
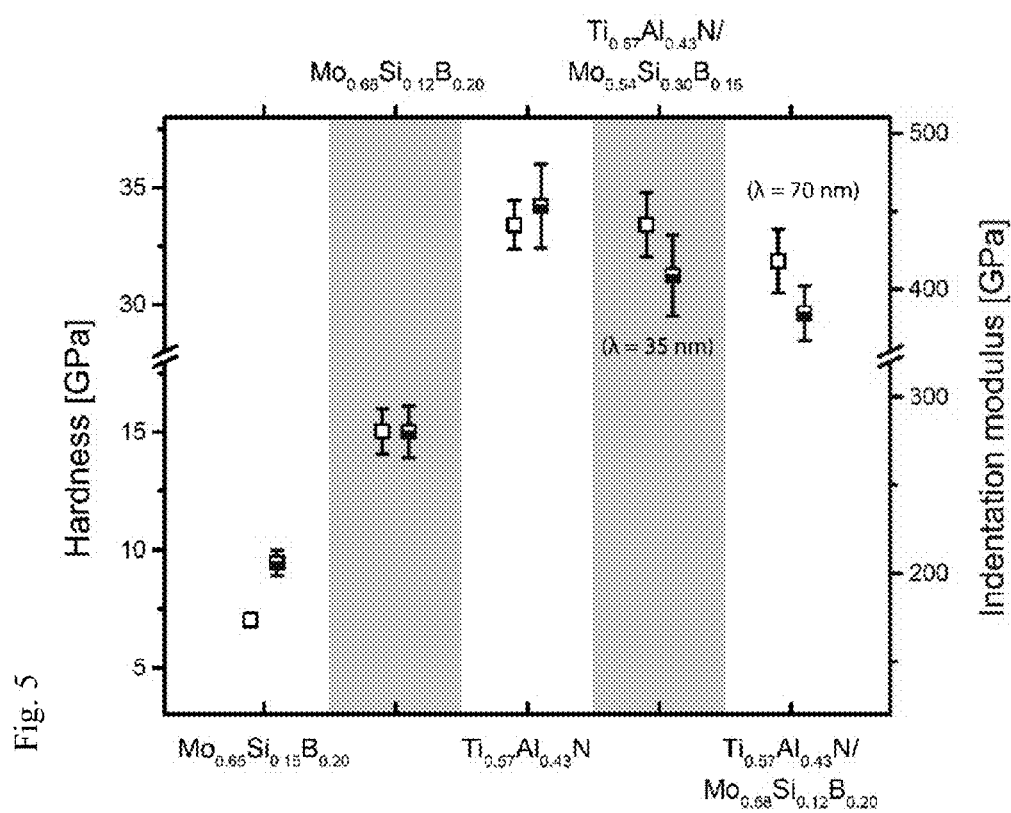
FIG. 5: Hardness and indentation modulus of ~0.7 μm thin $Mo_{0.65}Si_{0.15}B_{0.20}N$ and $Mo_{0.68}Si_{0.12}B_{0.20}$ coatings on top of ~1.1 μm $Ti_{0.57}Al_{0.43}N$ adhesion and supporting layers, arc evaporated $Ti_{0.57}Al_{0.43}N$, as well as $Ti_{0.57}Al_{0.43}N/Mo_{0.54}Si_{0.30}B_{0.16}$ and $Ti_{0.57}Al_{0.43}N/Mo_{0.68}Si_{0.12}B_{0.20}$ multilayers having bilayer periods of λ=35 and 70 nm, respectively.

Mechanical Properties:

The hardnesses of the ~0.70 μm thin $Mo_{0.68}Si_{0.12}B_{0.20}$ and $Mo_{0.65}Si_{0.15}B_{0.20}N$ layers on top of the ~1.10 μm thin $Ti_{0.57}Al_{0.43}N$ adhesion and supporting layer are with 15 and 7 GPa, respectively, significantly lower as the 33 GPa of the ~2.50 μm thin arc evaporated $Ti_{0.57}Al_{0.43}N$ coating, FIG. 5. Also their indentation moduli are with 280 and 205 GPa lower as the 440 GPa of $Ti_{0.57}Al_{0.43}N$.

Regardless of the lower hardness and indentation moduli of the $Mo_{0.68}Si_{0.12}B_{0.20}$ and $Mo_{0.65}Si_{0.15}B_{0.20}N$ layers, the $Ti_{0.57}Al_{0.43}N/Mo_{0.54}Si_{0.30}B_{0.16}$ and $Ti_{0.57}Al_{0.43}N/Mo_{0.68}Si_{0.12}B_{0.20}$ multilayers exhibit H and E values comparable to $Ti_{0.57}Al_{0.43}N$. Here, the $Ti_{0.57}Al_{0.43}N/Mo_{0.54}Si_{0.30}B_{0.16}$ multilayers are with 34 GPa slightly harder as the $Ti_{0.57}Al_{0.43}N/Mo_{0.68}Si_{0.12}B_{0.20}$ multilayers with 32 GPa. The slightly higher hardness for $Ti_{0.57}Al_{0.43}N/Mo_{0.54}Si_{0.30}B_{0.16}$ can be based on the smaller bilayer period, 35 vs. 70 nm, and smaller grain sizes, respectively. Probably as the individual $Ti_{0.57}Al_{0.43}N$ layers are still relatively thick with 29 and 55 nm, a superlattice effect was not observed.

Figure 6:
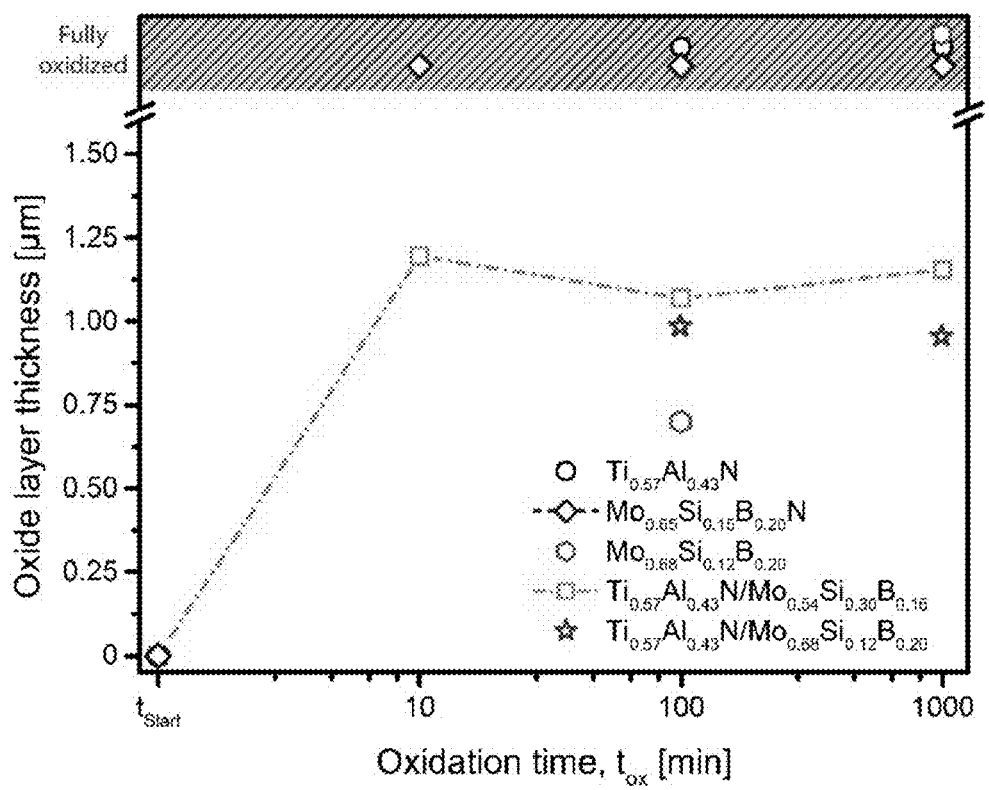
FIG. 6: Oxide layer thickness in relation to the oxidation time $t_{ox}$=10, 100, and 1000 min for ~2.5 μm $Ti_{0.57}Al_{0.43}N$, ~0.70 μm $Mo_{0.68}Si_{0.12}B_{0.20}$ and $Mo_{0.65}Si_{0.15}B_{0.20}N$ on top of ~1.1 μm $Ti_{0.57}Al_{0.43}N$, as well as $Ti_{0.57}Al_{0.43}N/Mo_{0.54}Si_{0.30}B_{0.16}$ and $Ti_{0.57}Al_{0.43}N/Mo_{0.68}Si_{0.12}B_{0.20}$ multilayers with bilayer periods of λ=35 and 70 nm, respectively. The hatched area on top indicates fully oxidized coatings.

Oxidation Resistance:

The oxidation resistance of all coatings investigated is presented in FIG. 6 by the oxide layer thickness after 10, 100, and 1000 min exposure in ambient air at 900° C. The multilayered coatings—orange squares refer to $Ti_{0.57}Al_{0.43}N/Mo_{0.54}Si_{0.30}B_{0.16}$ with λ=35 nm and red stars to $Ti_{0.57}Al_{0.43}N/Mo_{0.68}Si_{0.12}B_{0.20}$ with λ=70 nm—clearly outperform all other coatings investigated, exhibiting a consumed layer thickness of only ~1.0 μm (~35% of the total coating thickness) even after 1000 min. The almost unchanged oxidized layer thickness with increasing oxidation time from 10 to 1000 min suggests for the formation of a dense oxide scale effectively protecting the coating underneath. Isothermal DSC-TGA measurements (at 900 and 1000° C., not shown here) indicate that the oxidation rate for the multilayer coatings can be best described by a paralinear behavior, $w = \sqrt{k_p \cdot t} + c \cdot k_1 \cdot t$ [26], where the onset of oxidation is dominated by a parabolic rate to be followed by an extremely low linear rate. The data furthermore suggest for an oxidation activation energy of ~97 kJ/mol of the $Ti_{0.57}Al_{0.43}N/Mo_{0.54}Si_{0.30}B_{0.16}$ multilayer. For the other coatings, only the compound coating with a ~0.7 μm thin $Mo_{0.68}Si_{0.12}B_{0.20}$ layer on top of an ~1.1 μm thin arc evaporated $Ti_{0.57}Al_{0.43}N$ adhesion and supporting layer (green hexagons) is still intact after 100 min oxidation at 900° C., FIG. 6. Fully oxidized coatings are indicated by the red hatched area in FIG. 6. The arc evaporated $Ti_{0.57}Al_{0.43}N$ coating itself and the compound coating with a ~0.7 μm $Mo_{0.65}Si_{0.15}B_{0.20}N$ layer on top of the arc evaporated $Ti_{0.57}Al_{0.43}N$ adhesion and supporting layer (blue diamonds) are already fully oxidized after 100 min at 900° C. This again highlights the oxidation protective behavior of $Mo_{0.68}Si_{0.12}B_{0.20}$ (but also of $Mo_{0.54}Si_{0.30}B_{0.16}$, present in the $Ti_{0.57}Al_{0.43}N/Mo_{0.54}Si_{0.30}B_{0.16}$ multilayer with λ=35 nm). Both multilayers have comparable oxidation resistance with a slightly better performance of $Ti_{0.57}Al_{0.43}N/Mo_{0.68}Si_{0.12}B_{0.20}$ layer ($Mo_{0.54}Si_{0.30}B_{0.16}$: y/(x+y)=0.35 and x+y=0.46; $Mo_{0.68}Si_{0.12}B_{0.20}$: y/(x+y)=0.63 and x+y=0.32).

Based on these results the inventors suppose that the required B/Si ratio and minimum Si content to achieve outstanding oxidation resistance will be influenced by other elements present and the coating architecture, such as in our $Ti_{1-x}Al_xN/Mo_{1-x-y}Si_xB_y$ multilayers.

Figure 7B:
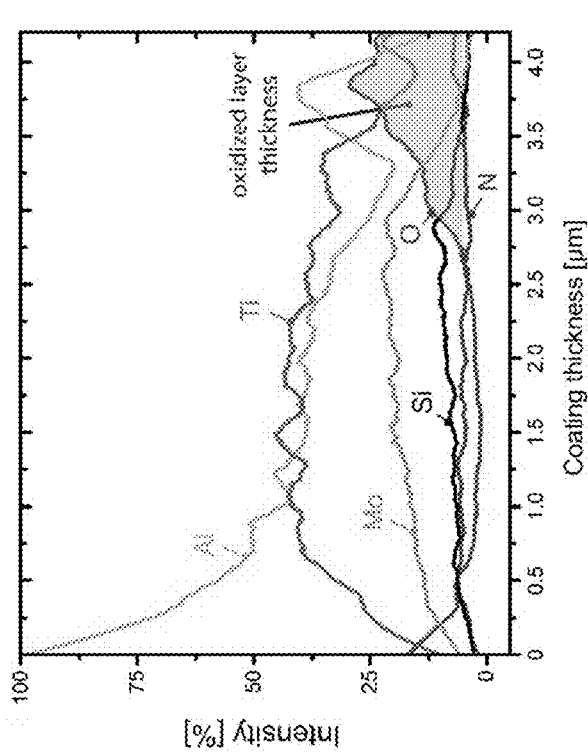
FIG. 7: EDS linescans of polished cross sections of ~0.70 μm thin $Mo_{0.68}Si_{0.12}B_{0.20}$ on top of arc evaporated ~1.1 μm $Ti_{0.57}Al_{0.43}N$ after $t_{ox}$=100 min and multilayered $Ti_{0.57}Al_{0.43}N/Mo_{0.54}Si_{0.30}B_{0.16}$ (λ=35 nm) after $t_{ox}$=1000 min oxidation in ambient air at 900° C.
Figure 7B:
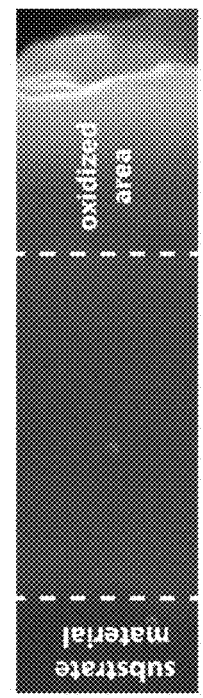
Figure 7A:
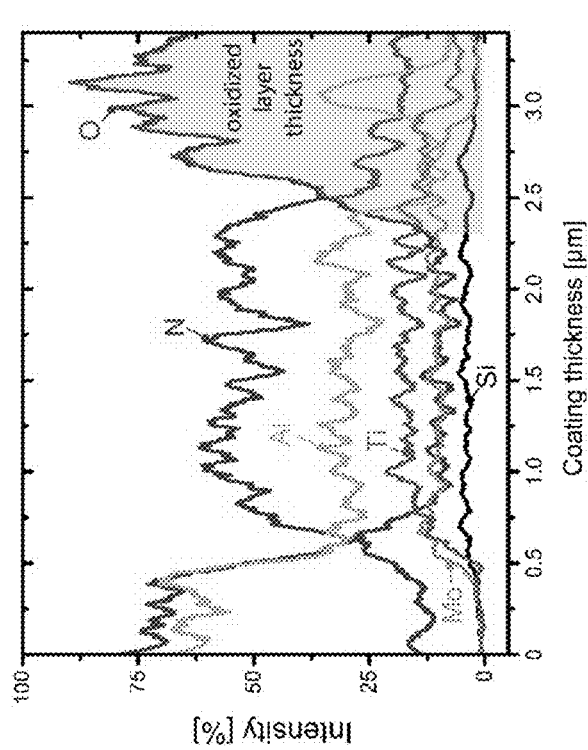
Figure 7A:
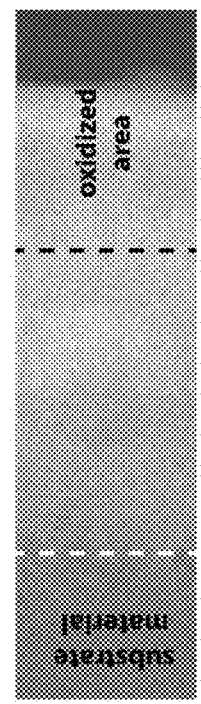

EDS line scans on cross-sections of the ~0.7 μm $Mo_{0.68}Si_{0.12}B_{0.20}$ layers (on arc evaporated $Ti_{0.57}Al_{0.43}N$ adhesion and supporting layers) after oxidation in ambient air at 900° C. and $t_{ox}$=100 min, FIG. 7a, indicate by the high oxygen content and Mo-depletion of the outer ~1.0 μm—for a fully oxidation of the $Mo_{0.68}Si_{0.12}B_{0.20}$ layer. The Mo-depletion suggests the formation of volatile Mo-oxides, but also a Mo-diffusion into the entire underlying $Ti_{0.57}Al_{0.43}N$ coating can be detected. The Al-rich zone on top of the oxide scale suggests for the formation of $Al_2O_3$, retarding oxygen inward diffusion, although oxygen can also be detected within the arced $Ti_{1-x}Al_xN$ layer. Nevertheless, the very high nitrogen signal along the $Ti_{1-x}Al_xN$ layer suggests for an intact nitride coating, protected by the outer layer. Increasing the oxidation time to 1000 min leads to a full oxidation of the entire $Mo_{0.68}Si_{0.12}B_{0.20}/Ti_{0.57}Al_{0.43}N$ compound coating.

The $Ti_{0.57}Al_{0.43}N/Mo_{0.54}Si_{0.30}B_{0.16}$ multilayer with λ=35 nm exhibits a significantly different appearance after the oxidation at 900° C., as suggested by their only ~1.15 μm thin oxidized layer thickness, FIG. 6, which can also be identified in the EDS linescan, see FIG. 7b. On top of the coating, the significantly higher signal for Al and oxygen indicate the formation of an $Al_2O_3$ outermost scale. This region is depleted in Mo, and followed by a region higher in Ti, lower in oxygen, but significantly depleted in Al. After these zones, oxygen is below the detection limit and the Ti, Al, N, Si, and Mo signals suggest for an intact $Ti_{0.57}Al_{0.43}N/Mo_{0.54}Si_{0.30}B_{0.16}$ multilayer.

Figures 8A, 8B, 8C:
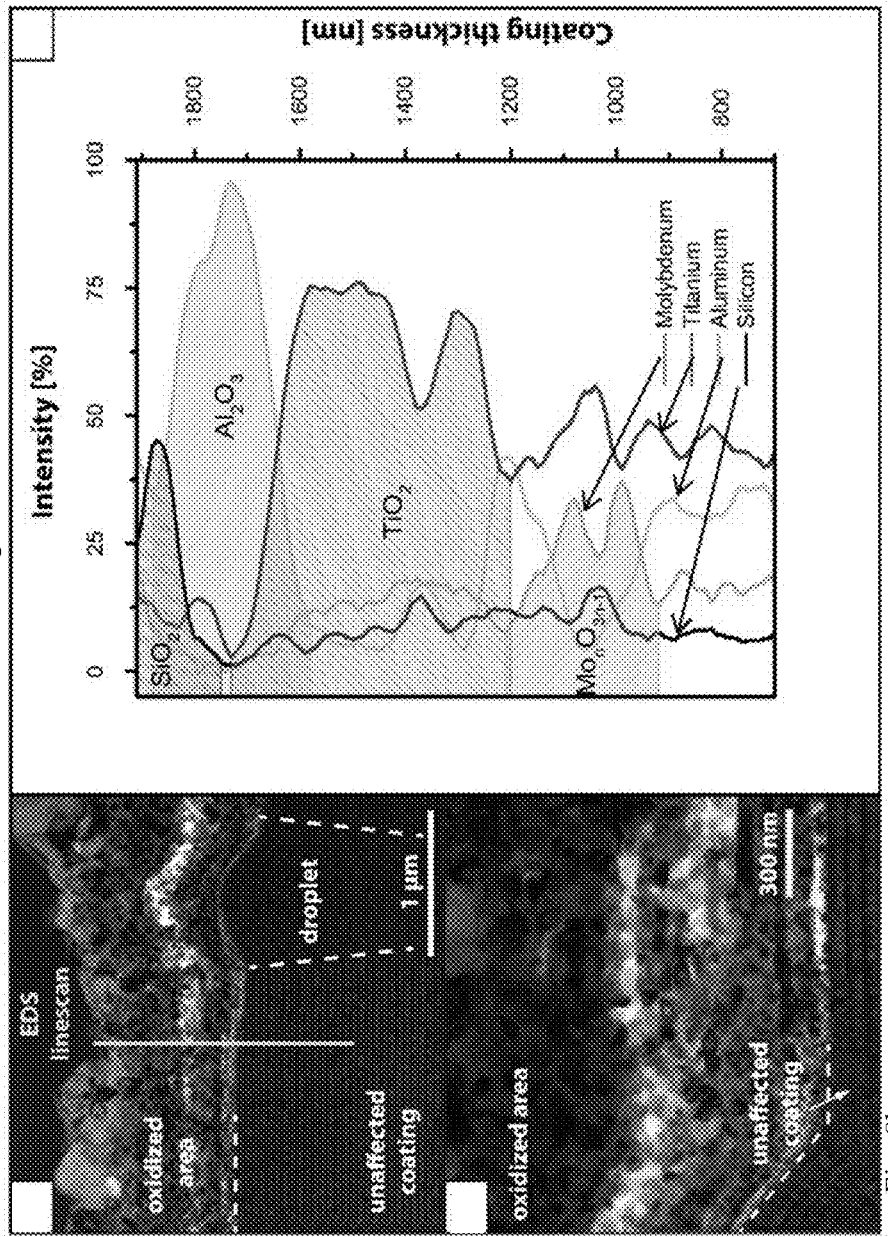
FIG. 8a: Intact multilayer underneath the protecting oxide scale after 1000 min exposure at 900° C.
FIG. 8b: The intact multilayer and protecting oxide of FIG. 8a at higher magnification.
FIG. 8c: EDS line scans.

TEM investigations of this $Ti_{0.57}Al_{0.43}N/Mo_{0.54}Si_{0.30}B_{0.16}$ multilayer, after 1000 min exposure at 900° C., clearly show the intact multilayer underneath the protecting oxide scale, FIG. 8a.

Especially, the area overgrowing a droplet (indicated by white dashed lines and labelled with droplet) highlights the effectiveness of the $Mo_{0.54}Si_{0.30}B_{0.16}$ layers to form dense protective oxides. The oxidized area clearly follows the curved nature (due to overgrowing a droplet) of the $Ti_{0.57}Al_{0.43}N/Mo_{0.54}Si_{0.30}B_{0.16}$ multilayer in this region, see FIG. 8a and the higher magnification in FIG. 8b.

Furthermore, contrary to other arc evaporated or sputtered $Ti_{1-x}Al_xN$ coatings, the oxidized area is distinctly separated from the remaining $Ti_{0.57}Al_{0.43}N/Mo_{0.54}Si_{0.30}B_{0.16}$ multilayer. Our cross section TEM investigations suggest that the $Mo_{0.54}Si_{0.30}B_{0.16}$ layers—represented by the darker contrast in FIG. 8a—form the border between oxide scale and remaining multilayer. Consequently, the $Mo_{0.54}Si_{0.30}B_{0.16}$ layers act as barriers for oxygen inward diffusion and retard oxidation kinetics through the formation of dense protective oxides based on borosilica and/or silica. Within the oxide scale, the crystallite sizes significantly increase from the region next to the intact multilayer to the outer surface region. Therefore, distinct SAED diffraction spots are obtained within the outermost oxide scale regions, and continuous ring patterns are obtained near to the multilayer. On the outermost area of the oxide scale, a Si enriched zone can be detected by EDS line scans, FIG. 8c, suggesting the formation of $SiO_2$. Silica seems to be a key requisite in $Mo_{1-x-y}Si_xB_y$ materials to allow for enhanced oxidation resistance above 1000° C. The outermost $SiO_2$ layer is followed by an Al rich zone, $Al_2O_3$, and after that by a Ti enriched area, indicative for $TiO_2$. After this sequence, again an Al-rich zone is present, which is followed by a Mo-rich zone, before the line scan as well as the TEM image suggests the intact multilayer.

The layered formation of the oxide scales can be related to the standard enthalpy of formation and the diffusion coefficients of the participating elements. The sequence $SiO_2/Al_2O_3/TiO_2$ would not agree from the sequence in the standard enthalpy of formation, but it is possible, that through the high diffusivity, Si tends to diffuse outwards and forms $SiO_2$ on top, protecting the underlying material. Si also exhibits the smallest atomic radius of 110 μm compared to 140 and 125 for Ti and Al, respectively. $Al_2O_3$ is on top of $TiO_2$.

The Mo-enriched oxide zone underneath the $SiO_2/Al_2O_3/TiO_2$, which also exhibits a higher Si content, is an effective diffusion barrier for further oxidation. The dense oxides above the Mo-enriched oxide retard the formation of volatile Mo-oxides, ensuring their effectiveness.

Figure 9A:
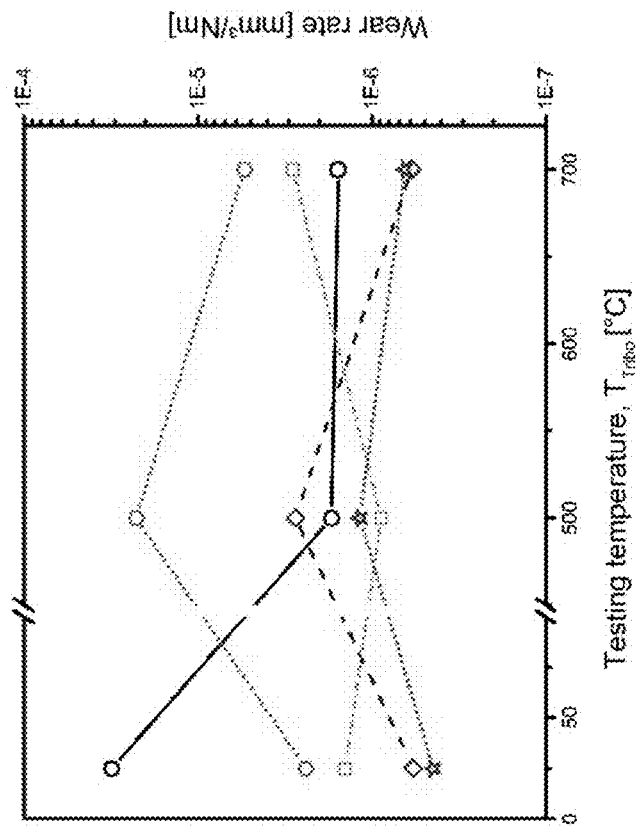
FIG. 9a: Coefficients of friction for the materials at different temperatures.

Tribological Behavior:

The coefficient of friction, CoF, for arc evaporated $Ti_{0.57}Al_{0.43}N$ (on high speed steel disks with 65 HRC) is ~1.0 at room temperature, the $Ti_{0.57}Al_{0.43}N/Mo_{0.68}Si_{0.12}B_{0.20}$ multilayer (with λ=70 nm) as well as the compound layers—with a ~0.70 μm thin $Mo_{0.68}Si_{0.12}B_{0.20}$ or $Mo_{0.65}Si_{0.15}B_{0.20}N$ layer on top of an arc evaporated $Ti_{0.57}Al_{0.43}N$ adhesion and supporting layer—have coefficients of friction of ~0.5, FIG. 9a.

Increasing the temperature from RT to 500 to 700° C. causes a change in CoF for $Ti_{0.57}Al_{0.43}N$ from about 1.0 to 0.5 to 0.6, respectively. The other three coatings ($Ti_{0.57}Al_{0.43}N/Mo_{0.68}Si_{0.12}B_{0.20}$ multilayer, $Mo_{0.68}Si_{0.12}B_{0.20}/Ti_{0.57}Al_{0.43}N$ and $Mo_{0.65}Si_{0.15}B_{0.20}N/Ti_{0.57}Al_{0.43}N$ compound coatings) exhibit their highest CoF values (between 0.6 and 1.0) at 500° C., which decreases (to CoF values between 0.4 and 0.6) with increasing $T_{tribo}$ to 700° C., see FIG. 9a.

Figure 9B:
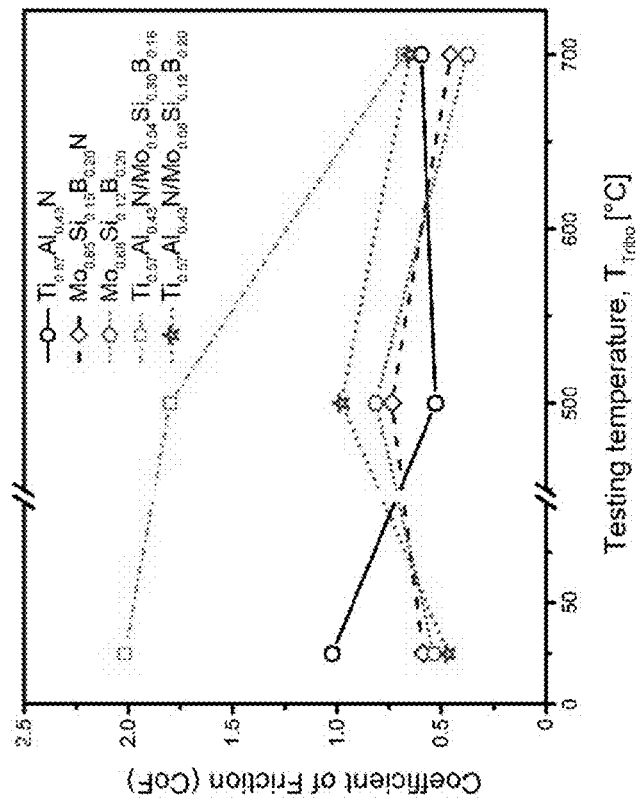
FIG. 9b: Wear rates for the materials at different temperatures.

The $Ti_{0.57}Al_{0.43}N/Mo_{0.54}Si_{0.30}B_{0.16}$ multilayer having a bilayer period of 35 nm exhibits the highest CoF over the whole temperature range among all coatings studied, with rather high values of ~2.0 at RT and 500° C. However, at 700° C. the steady state CoF is significantly reduced to ~0.7, close to the CoF of the other $Ti_{0.57}Al_{0.43}N/Mo_{0.68}Si_{0.12}B_{0.20}$ multilayer having a bilayer period of 70 nm. The relatively high CoF of ~2.0 at RT and 500° C. has been cross-checked and confirmed several times also by preparing slightly modified multilayers (with slightly thinner $Mo_{0.54}Si_{0.30}B_{0.16}$ layers as this $Ti_{0.57}Al_{0.43}N/Mo_{0.54}Si_{0.30}B_{0.16}$ multilayer with λ=35 nm). Hence, these high values are not an artefact and a result of the multilayer arrangement between arc evaporated $Ti_{0.57}Al_{0.43}N$ and sputtered $Mo_{0.54}Si_{0.30}B_{0.16}$ layers. However, even these coatings exhibit, especially at RT, lower wear rates as the arc evaporated $Ti_{0.57}Al_{0.43}N$, see FIG. 9b. The lowest wear rate (≤$10^{-6}$ mm$^3$/Nm) over the whole temperature range investigated, is obtained for the $Ti_{0.57}Al_{0.43}N/Mo_{0.68}Si_{0.12}B_{0.20}$ multilayer having a bilayer period of 70 nm, see the red stars in FIG. 9b. Especially at RT, this multilayer exhibits a by at least two orders of magnitude lower wear rate than the arc evaporated $Ti_{0.57}Al_{0.43}N$. The low wear rate in combination with the relatively low CoF, especially at RT and 700° C., suggests for excellent tribological properties of the $Ti_{0.57}Al_{0.43}N/$ $Mo_{0.68}Si_{0.12}B_{0.20}$ multilayer. Maybe this is based on a complex interplay between Ti- and Mo-based oxides, which can form solid lubricants.

According to the investigation of the deposited $Mo_{0.68}Si_{0.12}B_{0.20}/Ti_{0.57}Al_{0.43}N$ and $Mo_{0.65}Si_{0.15}B_{0.20}N/Ti_{0.57}Al_{0.43}N$ compound coatings—composed of ~0.70 µm thin sputtered $Mo_{1-x-y}Si_xB_y$ and $Mo_{1-x-y}Si_xB_yN$ layers on ~1.10 µm thin arc evaporated $Ti_{0.57}Al_{0.43}N$ layers—and $Ti_{0.57}Al_{0.43}N/Mo_{0.68}Si_{0.12}B_{0.20}$ and $Ti_{0.57}Al_{0.43}N/Mo_{0.54}Si_{0.30}B_{0.16}$ multilayer coatings (70 nm bilayer consisting of 15 nm $Mo_{0.68}Si_{0.12}B_{0.20}$ and 35 nm bilayer consisting of 6 nm $Mo_{0.54}Si_{0.30}B_{0.16}$) as described above it was determined that:

$Mo_{0.68}Si_{0.12}B_{0.20}$ exhibits an XRD amorphous structure, where nm-sized grains are embedded in a segregation driven tissue phase. Contrary, $Mo_{0.65}Si_{0.15}B_{0.20}N$ shows a columnar, feather-like growth morphology with small ~5-nm-sized crystals. Both sputtered layers, $Mo_{0.68}Si_{0.12}B_{0.20}$ and $Mo_{0.65}Si_{0.15}B_{0.20}N$, are well adherent to arc evaporated $Ti_{0.57}Al_{0.43}N$, where even coherent interface regions are formed between $Mo_{0.65}Si_{0.15}B_{0.20}N$ and $Ti_{0.57}Al_{0.43}N$.

Although the hardness of the ~0.7 µm thin $Mo_{0.68}Si_{0.12}B_{0.20}$ and $Mo_{0.65}Si_{0.15}B_{0.20}N$ layers on arc evaporated $Ti_{0.57}Al_{0.43}N$ is only 15 and 7 GPa, the $Ti_{0.57}Al_{0.43}N/Mo_{0.54}Si_{0.30}B_{0.16}$ and $Ti_{0.57}Al_{0.43}N/Mo_{0.68}Si_{0.12}B_{0.20}$ multilayers exhibit excellent hardnesses of ~32-34 GPa and indentation moduli of ~385-405 GPa, respectively.

$Ti_{0.57}Al_{0.43}N$ as well as $Mo_{0.65}Si_{0.15}B_{0.20}N/Ti_{0.57}Al_{0.43}N$ and $Mo_{0.68}Si_{0.12}B_{0.20}/Ti_{0.57}Al_{0.43}N$ compound coatings are already fully oxidized after 100 and 1000 min exposure to ambient air at 900° C., respectively. Contrary, even after 1000 min only ~1.05-1.25 µm of the multilayers are transformed into a well adherent and dense protective oxide scale, indicating superior oxidation resistance with respect to their individual components. The oxide scale consists of a layered arrangement of Si-, Al-, Ti-, and again Al-rich oxides above the Mo-rich oxide at the interface to the multilayer.

Although the mechanical properties as well as the oxidation resistance of both multilayers are comparable and excellent, the Mo-rich multilayer (70 nm bilayer period), $Ti_{0.57}Al_{0.43}N/Mo_{0.68}Si_{0.12}B_{0.20}$, also show outstanding properties during ball-on-disk tests considering the CoF and wear rates. The steady state coefficients of friction are ~0.5 at RT, 500 and 700° C. combined with low wear rates below $10^{-6}$ mm$^3$/Nm after 500 m sliding against 6-mm-alumina-balls.

An optimized architectural arrangement of nm-thin $Mo_{1-x-y}Si_xB_y$ and $Ti_{1-x}Al_xN$ leads to superior oxidation resistance (exceeding the oxidation resistance of the individual layers) combined with excellent mechanical and tribological properties.

Concretely the present inventions discloses a coating comprising a multilayer film exhibiting a multilayered structure formed by a plurality N≥2, preferably N≥4, of layers type I and type II deposited alternated one on each other, unique in:

the layers of type I consist of a metal nitride comprising material I having chemical composition $Me1_{1-a}Me2_aZI$, and the layers of type II consist of a Mo comprising material II having chemical composition $Mo_{1-b-c}Si_cB_bZII$ or $Mo_{1-b-c}Si_cB_b$, where:

Me1 is one element selected from the groups IVB, VB, and VIIB of the periodic table of the elements excepting Mo, preferably Me1 is Ti, Me2 is one element selected from the group IIIA of the periodic table of the elements and Si, preferably Me2 is Al, ZI is N or NO or NC or NCO, preferably ZI is N ZII is one or more elements selected from N, O and C, b and c are atomic concentration coefficients and 1−b−c>0, 0<b≤0.99, and 0<c≤0.99.

According to a preferred embodiment of a coating according to the present invention:

the layers of type I comprise at least mainly and mostly TiAlN or are TiAlN layers, and the layers of type II comprise at least mainly and mostly MoSiB or are MoSiB layers.

According to a further embodiment the layers of the type I and II have individual thicknesses in nanometer magnitude and the bilayer period λ corresponding to the sum of the thickness of one layer of the type I and one layer of the type II deposited one on each other or the sum of the thickness of one layer of the type II and one layer of the type I deposited one on each other in the multilayer film has a value 4 and 240 nm.

Preferably the bilayer period λ is less than 100 nm or less than 50 nm.

Preferably the layers of type I have an individual thickness larger than the layers of type II.

According to one more preferred embodiment of a coating according to the present invention:

the layers of type I are TiAlN layers having chemical composition and the layers of type II are MoSiB layers having chemical composition $Mo_{1-y-z}Si_yB_z$, where:

the coefficients x, y and z correspond to the concentration in atomic percentage of Al in the TiAlN layers without considering the nitrogen concentration, the coefficients y and z correspond to the concentrations in atomic percentage of Si and B in the MoSiB layers, respectively, 25≤x≤80, 1−y−z>y+z, y>0, and z>0

Preferably: 1−y−z>50, z<30, and or 1−y−z<80.

The present invention relates at the same time to a method for producing the inventive coatings which comprises the deposition of the layers of the type I by using cathodic arc PVD techniques.

The present invention relates likewise to a method for producing the inventive coatings which comprises the deposition of the layers of the type II by using sputter or HIPIMS PVD techniques.

According to a preferred embodiment of a method according to the present invention the layers of type I are produced by using cathodic arc PVD techniques and the type II are produced by using sputter or HIP IMS PVD techniques.

What is claimed is:

1. Coating comprising a multilayer film exhibiting a multilayered structure formed by a plurality N≥2 of layers type I and type II deposited alternated one on each other, characterized in that:

the layers of type I consist of a metal nitride comprising material I having chemical composition $Me1_{1-a}Me2_aZI$, and the layers of type II consist of a Mo comprising material II having chemical composition $Mo_{1-b-c}Si_cB_bZII$ or $Mo_{1-b-c}Si_cB_b$, where:

Me1 is one element selected from the groups IVB, VB, and VIIB of the periodic table of the elements excepting Mo, Me2 is one element selected from the group IIIA of the periodic table of the elements and Si, ZI is N or NO or NC or NCO, ZII is one or more elements selected from N, O and C, b and c are atomic concentration coefficients and $1-b-c>0$, $0<b\leq0.99$, and $0<c\leq0.99$.

2. Coating according to claim 1, characterized in that:

the layers of type I comprise at least mainly and mostly TiAlN or are TiAlN layers, and the layers of type II comprise at least mainly and mostly MoSiB or are MoSiB layers.

3. Coating according to claim 1 characterized in that the layers of the type I and II have individual thicknesses in nanometer magnitude and the bilayer period λ corresponding to the sum of the thickness of one layer of the type I and one layer of the type II deposited one on each other or the sum of the thickness of one layer of the type II and one layer of the type I deposited one on each other in the multilayer film has a value 4 and 240 nm.

4. Coating according to claim 3 characterized in that the bilayer period λ is less than 100 nm or less than 50 nm.

5. Coating according to claim 1 characterized in that the layers of type I have an individual thickness larger than the layers of type II.

6. Coating according to claim 2, characterized in that:

the layers of type I are TiAlN layers having chemical composition $Ti_{1-x}Al_xN$, and the layers of type II are MoSiB layers having chemical composition $Mo_{1-y-z}Si_yB_z$, where:

the coefficients x, y and z correspond to the concentration in atomic percentage of Al in the TiAlN layers without considering the nitrogen concentration, the coefficients y and z correspond to the concentrations in atomic percentage of Si and B in the MoSiB layers, respectively, $25\leq x\leq 80$, $1-y-z>y+z$, $y>0$, and $z>0$.

7. Coating according to claim 6, characterized in that $1-y-z>50$, $z<30$.

8. Coating according to claim 6, characterized in that $1-y-z<80$.

9. Method for producing a coating according to claim 1 characterized in that the layers of the type I are produced by using cathodic arc PVD techniques.

10. Method for producing a coating according to claim 1 characterized in that the layers of the type II are produced by using sputter or HIPIMS PVD techniques.

11. Method according to claim 9, wherein the layers of type I are produced by using cathodic arc PVD techniques and the type II are produced by using sputter or HIPIMS PVD techniques.

12. Coating according to claim 1 wherein the multilayer structure is formed by N≥4 of the layers type I and type II.

13. Coating according to claim 1 wherein Me1 is Ti, Me2 is Al, and ZI is N.

* * * * *